(«12») United States Patent
Zhou et al.

(10) Patent No.: US 9,887,293 B2
(45) Date of Patent: Feb. 6, 2018

(54) SEMICONDUCTOR DEVICE

(71) Applicant: UNITED MICROELECTRONICS CORP., Hsin-Chu (TW)

(72) Inventors: Zhibiao Zhou, Singapore (SG); Ding-Lung Chen, Singapore (SG); Chen-Bin Lin, Taipei (TW); Sanpo Wang, Singapore (SG); Chung-Yuan Lee, Taoyuan (TW); Chi-Fa Ku, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/191,542

(22) Filed: Jun. 24, 2016

(65) Prior Publication Data

US 2017/0338351 A1    Nov. 23, 2017

(30) Foreign Application Priority Data

May 20, 2016    (TW) .............................. 105115666 A (51) Int. Cl.
*H01L 29/78*     (2006.01)
*H01L 29/786*    (2006.01)
*H01L 29/792*    (2006.01)
*H01L 29/788*    (2006.01)

(52) U.S. Cl.
CPC ...... *H01L 29/78609* (2013.01); *H01L 29/788* (2013.01); *H01L 29/7869* (2013.01); *H01L 29/78648* (2013.01); *H01L 29/792* (2013.01)

(58) Field of Classification Search
CPC ............... H01L 29/788; H01L 29/7869; H01L 29/78648; H01L 29/78609
See application file for complete search history.

(56) References Cited

U.S. PATENT DOCUMENTS

| | | |
|---|---|---|
| 7,611,941 B1 | 11/2009 | Shum |
| 7,919,772 B2 | 4/2011 | Furukawa |
| 8,222,696 B2 | 7/2012 | Yamazaki |
| 8,319,267 B2 | 11/2012 | Kato |
| 8,319,269 B2 | 11/2012 | Ieda |
| 8,559,220 B2 | 10/2013 | Yamazaki |
| 8,916,865 B2 * | 12/2014 | Yamazaki ......... H01L 29/42384 257/43 |

(Continued)

OTHER PUBLICATIONS

Hsu, Title of Invention: Semiconductor Device and Method for Forming the Same, U.S. Appl. No. 14/872,156, filed Oct. 1, 2015.

*Primary Examiner* — Julia Slutsker
(74) *Attorney, Agent, or Firm* — Winston Hsu (57) ABSTRACT

A semiconductor device is provided in the present invention, which includes a substrate, an oxide-semiconductor layer, source/drain regions, a dielectric layer, a first gate electrode, a second gate electrode and a charge storage structure. The oxide-semiconductor layer is disposed on the first gate electrode on the substrate. The source/drain regions are disposed on the oxide-semiconductor layer. The first dielectric layer covers on the oxide-semiconductor layer and source/drain regions. A second gate electrode is disposed between source/drain regions and partially covers the oxide-semiconductor layer. The oxide-semiconductor layer may be optionally disposed between the first gate electrode and the oxide-semiconductor layer or be disposed on the second gate electrode.

10 Claims, 5 Drawing Sheets

(56) References Cited

U.S. PATENT DOCUMENTS

| | | | |
|---|---|---|---|
| 9,105,468 B2 | 8/2015 | Rabkin | |
| 2006/0022244 A1* | 2/2006 | Shau | G11C 16/02 257/296 |
| 2013/0193432 A1* | 8/2013 | Yamazaki | H01L 29/7869 257/43 |
| 2014/0252448 A1* | 9/2014 | Bedell | H01L 29/788 257/316 |
| 2015/0179810 A1 | 6/2015 | Yamazaki | |

* cited by examiner

SEMICONDUCTOR DEVICE

BACKGROUND OF THE INVENTION

1. Field of the Invention

The present invention relates generally to a semiconductor device, and more particularly, to an oxide-semiconductor device available for data storage.

2. Description of the Prior Art

Nowadays, the semiconductor device for data storage may be classified into the volatile device and the non-volatile device. When the power supply is interrupted, the data stored in the volatile device would loss. In comparison, the data stored in the non-volatile device would remain even when the power supply is interrupted, so that it is widely used in products. Nowadays, the non-volatile memory device that is widely used is, for example, magnetic devices, optical discs, flash memory and other semiconductor memory, etc. The approach of these memory devices is to use the silicon nitride layer as a charge trapping medium to constitute the floating gate. The tunneling effect and source side injection effect may trap the electrons in the floating gate to achieve the function of data storage.

However, in the technical field, how to achieve the long-term charge storage and retention in the floating gate to improve the data reliability of the memory is still a critical subject in current research and development.

SUMMARY OF THE INVENTION

One objective of the present invention is to provide a semiconductor device with oxide-semiconductor structures available for data storage to effectively improve the reliability of the memory device during data reading or writing.

To achieve the aforesaid objective, a semiconductor device is provided in an embodiment of the present invention, which includes the components of a substrate, an oxide-semiconductor layer, two source/drain regions, a dielectric layer, a second gate electrode and a charge storage structure. The oxide-semiconductor layer is disposed on a first gate electrode on the substrate. The two source/drain regions are disposed on the oxide-semiconductor layer. The first dielectric layer covers on the oxide-semiconductor layer and the two source/drain regions. The second gate electrode is disposed between the two source/drain regions and partially covers the oxide-semiconductor layer. The charge storage structure is disposed between the first gate electrode and the oxide-semiconductor layer.

To achieve the aforesaid objective, a semiconductor device is provided in an embodiment of the present invention, which includes the components of a substrate, an oxide-semiconductor layer, two source/drain regions, a dielectric layer, a second gate electrode and a charge storage structure. The oxide-semiconductor layer is disposed on a first gate electrode on the substrate. The two source/drain regions are disposed on the oxide-semiconductor layer. The first dielectric layer covers on the oxide-semiconductor layer and the two source/drain regions. The second gate is disposed between the two source/drain regions and partially covers the oxide-semiconductor layer. The charge storage structure is disposed on the second gate electrode.

The semiconductor device of the present invention is provided with oxide-semiconductor structures for data storage. The primary approach is to dispose a charge storage structure between a gate electrode served as a back gate structure and an oxide-semiconductor layer served as a channel layer, or to dispose the charge storage structure on a gate electrode served as a top gate structure. The charge storage structure may be a charge trapping structure or a floating gate. In other words, the gate of the back gate structure or top gate structure is used as a control gate to store induced charges in the charge storage structure. In this way, the function of signal reading may be achieved by voltage changes in the semiconductor device of the present invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Features will become apparent to those of ordinary skill in the art by describing in detail exemplary embodiments with reference to the attached drawings, in which.

DETAILED DESCRIPTION

To provide a better understanding of the present invention to those of ordinarily skilled in the art, several exemplary embodiments will be detailed as follows, with reference to the accompanying drawings with numbered elements to elaborate the contents and effects to be achieved.

Figure 1:
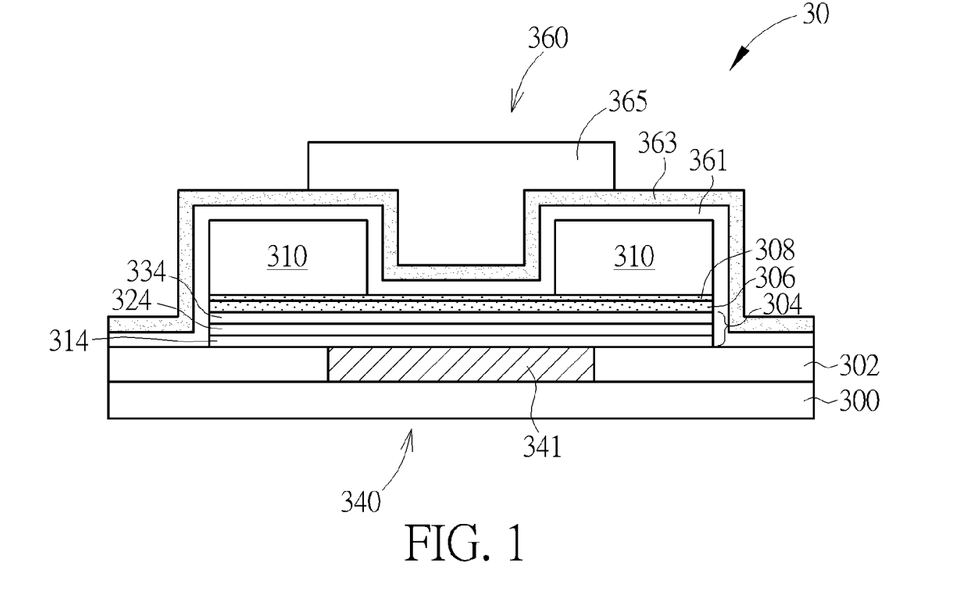
FIGS. 1-2 are schematic cross-sectional views of a semiconductor device in accordance with a first embodiment of the present invention.

Please refer to FIG. 1, which is a schematic cross-sectional view of a semiconductor device 30 in accordance with a first embodiment of the present invention. The semiconductor device 30 may be, for example, an oxide-semiconductor (OS) structure with dual gate transistors, including a charge storage structure and two source/drain regions 310 on a substrate 300, a top gate electrode structure 360 on the charge storage structure and a back gate electrode structure 340 below the charge storage structure.

More specifically, the substrate 300 of the semiconductor device 30 may be any component with supporting ability, such as a silicon-containing substrate or silicon-on-insulator (SOI), but not limited thereto. The substrate 300 is provided with at least one insulating layer formed thereon, such as an insulating layer 302 with single layer structure or an insulating layer with multilayer structure (not shown). The material of the insulating layer may include common low-k materials such as silicon oxide or high-k materials such as metal oxide, preferably rare earth oxide layer such as hafnium oxide ($HfO_2$), etc. In the embodiment, the insulating layer 302 is further provided with a conductive layer in any pattern form therein to serve as a gate electrode 341, including metals like Cu, Al, Mo, Ti, Ta or the aforesaid metal nitride or metal oxide, etc. Nevertheless, in other embodiment of the present invention, the conductive layer may be optionally formed inside the insulating layer with multilayer structure. Alternatively, the insulating layer 302 or the insulating layer with multilayer structure may be further provided with a metal interconnection system (not shown), electronic devices (not shown) like metal-oxide-semiconductor (MOS) or passive devices (not shown) like capacitors or resistors, but not limited thereto.

The charge storage structure is formed on the insulating layer 302 and the gate electrode 341 and directly contacts the gate electrode 341. In the embodiment, the storage structure is, for example, a charge trapping structure 340 including a first dielectric layer 314, a charge trapping layer 324 and a second dielectric layer 334. In one embodiment of the present invention, the first dielectric layer 314 and the second dielectric layer 334 may be made of silicon oxide, and the charge trapping layer 324 may be made of silicon nitride (SiN), tantalum oxide (TaO), strontium titanate or hafnium oxide, etc., to constitute an oxide/nitride-oxide (ONO) structure.

The substrate 300 is further provided with an oxide-semiconductor layer 308 and source/drain regions 310 stacking sequentially on the charge trapping structure 304. In the embodiment, the oxide-semiconductor layer 308 is a single layer structure including the material of InGaZnO, $InGaO_2$, $InZnO_2$, ZnInO or GaZnO, etc. The CAAC-InGaZnO with the characteristics of high carrier mobility and low leakage is particularly preferred in the embodiment to serve as a channel layer for the gate electrode 341. However, those ordinarily skilled in the art should easily understand that the oxide-semiconductor layer in other embodiment of the present invention may optionally include other materials or multilayer structure, and the included layers may be formed of same or different materials which is not limited to the aforesaid aspect. Source/drain regions 310 may include various conductive materials, such as Al, Mo, Ti, Ta, Cd or the aforesaid nitride, oxide or alloys, etc., and moreover, the source/drain regions 310 are spaced apart from each other to expose a part of the oxide-semiconductor layer 308 from the two source/drain regions 310, as shown in FIG. 1.

In addition, the semiconductor device 30 of the present invention may be optionally provided with an insulating layer 306 formed between the charge trapping structure 304 and the oxide-semiconductor layer 308. The insulating layer 306 may include common low-k materials or high-k materials, preferably includes an oxide-semiconductor material such as InGaZnO, $InGaO_2$, $InZnO_2$, ZnInO or GaZnO, etc., and more preferably includes the oxide semiconductor material different from the material of the oxide-semiconductor layer 308. The chemical vapor deposition (CVD) may be used in the embodiment to form a material stack sequentially including the first dielectric layer 314, the charge trapping layer 324, a second dielectric layer 334, the insulating layer 306, the oxide-semiconductor layer 308 and source/drain regions 310. At least one photo-etching-process (PEP) is performed to simultaneously pattern the material stack to vertically align the sidewalls of the first dielectric layer 314, the charge trapping layer 324, the second dielectric layer 334, the insulating layer 306, the oxide-semiconductor layer 308 and the source/drain regions 310, so that the two source/drain regions 310 may overlap the oxide-semiconductor layer 308 and the charge trapping structure 304 in a projection direction perpendicular to the substrate 300, as shown in FIG. 1. The oxide-semiconductor layer 308 and the charge trapping structure 304 are disposed corresponding to the gate electrode 341 below. For example, the oxide-semiconductor layer 308 and the charge trapping structure 304 in the embodiment are made to at least partially overlap the gate electrode 341 below, preferably in the middle of the oxide-semiconductor layer 308 and the charge trapping structure 304 in the projection direction perpendicular to the substrate 300 and is completely covered by the oxide-semiconductor layer 308 and the charge trapping structure 304, as shown in FIG. 1. Accordingly, the oxide-semiconductor layer 308 served as a channel layer and the underlying gate electrode 341 can constitute a back gate structure 340.

Figure 2:
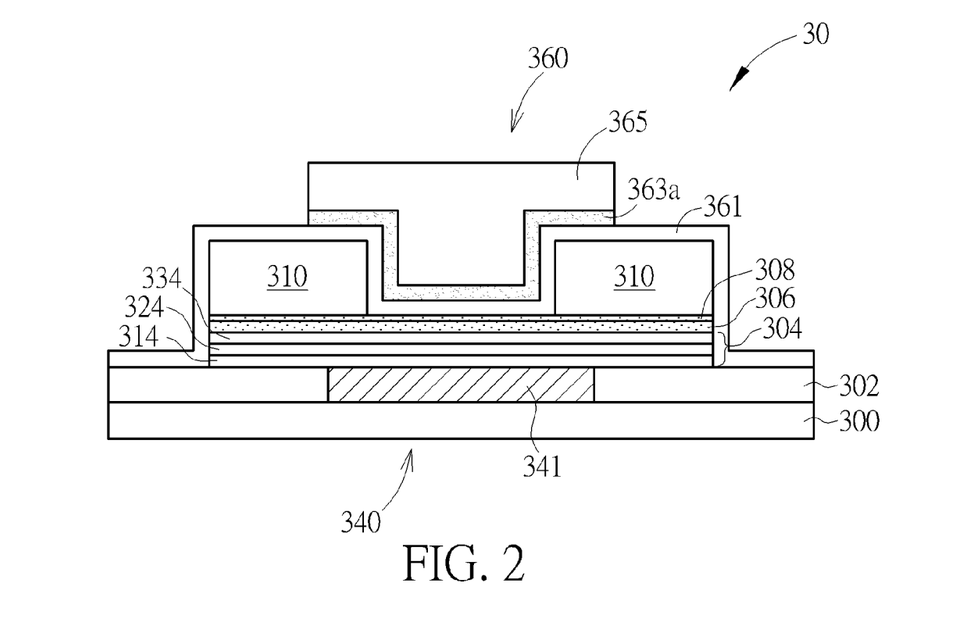

On the other side, the top gate structure 360 is composed of the oxide-semiconductor layer 308 and a dielectric layer and a gate electrode 365 between the source/drain regions 310. In the embodiment, the dielectric layer includes a gate dielectric 361 directly contacting and covering the source/drain regions 310 and the oxide-semiconductor layer 308 and a gate dielectric layer 363 covering on the gate dielectric layer 361. Preferably, the gate dielectric layer 361 and the gate dielectric layer 363 further cover the sidewall of the charge trapping structure 304, as shown in FIG. 1, thereby preventing the charge leakage from lateral surfaces of the charge trapping structure 304. The gate dielectric layer 361 and the gate dielectric layer 363 may optionally include compact dielectric materials, such as rare earth oxide like hafnium oxide or aluminum oxide. Alternatively, only the gate dielectric layer 361 in the structure would include compact dielectric materials, while the gate dielectric layer 363 is chosen to include an oxide-semiconductor material, such as InGaZnO, $InGaO_2$, $InZnO_2$, ZnInO or GaZnO, but not limited thereto. In another embodiment, only the gate dielectric layer 361 is made to cover the sidewall of the charge trapping structure 304, while the sidewalls of the gate dielectric layer 363a and the gate electrode 365 are aligned through one patterning process, as shown FIG. 2.

The gate 365 may be made of various conductive materials, such as Cu, Al, Mo, Ti, Ta and the aforesaid metal nitride or metal oxide, and moreover, the gate electrode 365 may at least partially overlap the underlying oxide-semiconductor layer 308. For example, the gate electrode 365 is made corresponding to the underlying oxide-semiconductor layer 308. Preferably, the gate electrode 365 is made to be located in the middle of the oxide-semiconductor layer 308 in the projection direction perpendicular to the substrate 300 and partially covers the oxide-semiconductor layer 308, as shown in FIG. 1.

Accordingly, the semiconductor device 30 in the embodiment is provided with the charge trapping structure 304 between the back gate structure 340 and the top gate structure 360, so that the back gate structure 340 may be used to control the source/drain regions 310 to store induced charges in the charge trapping structure 304 to change the initial voltage of the back gate structure 340 and achieve the purpose of store 0 or 1 data. In this way, data accessing can be properly controlled by using the back gate structure 340 to achieve the function of the data storage in semiconductor device 30. Later, the semiconductor device 30 of the present invention may be further electrically connected to other semiconductor devices, such as other memory devices or capacitors, through at least one contact plug (not shown) to further improve the capacity of data retention of the semiconductor device 30.

Figure 3:
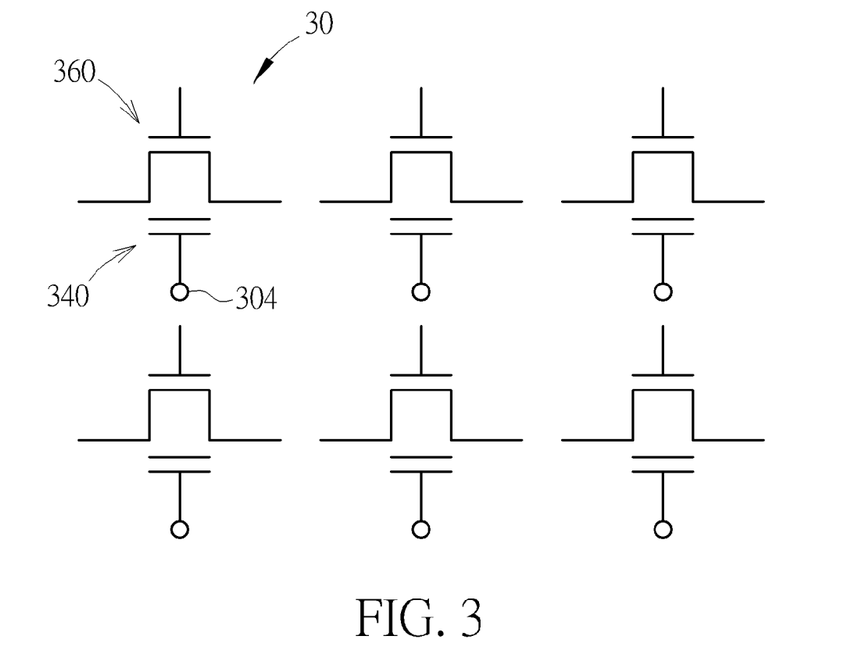
FIG. 3 is an equivalent circuit diagram of the semiconductor device in accordance with the first embodiment of the present invention.

Please refer to FIG. 3, which is an equivalent circuit diagram of the semiconductor device 30. In practical application, the semiconductor device 30 may be used stand-alone, or may be optionally used in serial or parallel connection with multiple semiconductor devices 30, as shown in FIG. 3. In the present invention, the charge trapping structure 304 is disposed on the back gate structure 340 of each semiconductor device 30 to trap induced charges and change the initial voltage of the back gate structure 340. Accordingly, the back gate structure 340 of each semiconductor device 30 would not have the same initial voltage although they are serially connected to each other. In this case, different voltages may be read out from the back gate structure 340 and top gate structure 360 when a voltage is supplied to the semiconductor device 30. The effect of data reading can be achieved through the voltage ($V_{th}$) shift of the back gate structure 340 and the top gate structure 360. In other words, the initial voltage of the back gate structure 340 can be changed by using the charge trapping structures 304 in the semiconductor device 30 to achieve the data storage function, no matter the semiconductor devices 30 are serial-connected or parallel-connected.

Those of ordinarily skilled in the art should easily understand that the semiconductor device of the present invention may be formed by other methods rather than limited to the aforesaid manufacturing steps. Accordingly, other embodiments or variations directing to the semiconductor devices and the manufacturing methods will be further described in following paragraphs. To simplify the disclosure, the following description will be focused and directed to the different features between the embodiments rather than redundantly repeating the similar components. In addition, like reference numerals will refer to like elements throughout the disclosure to facilitate the comparison between the embodiments.

Figure 4:
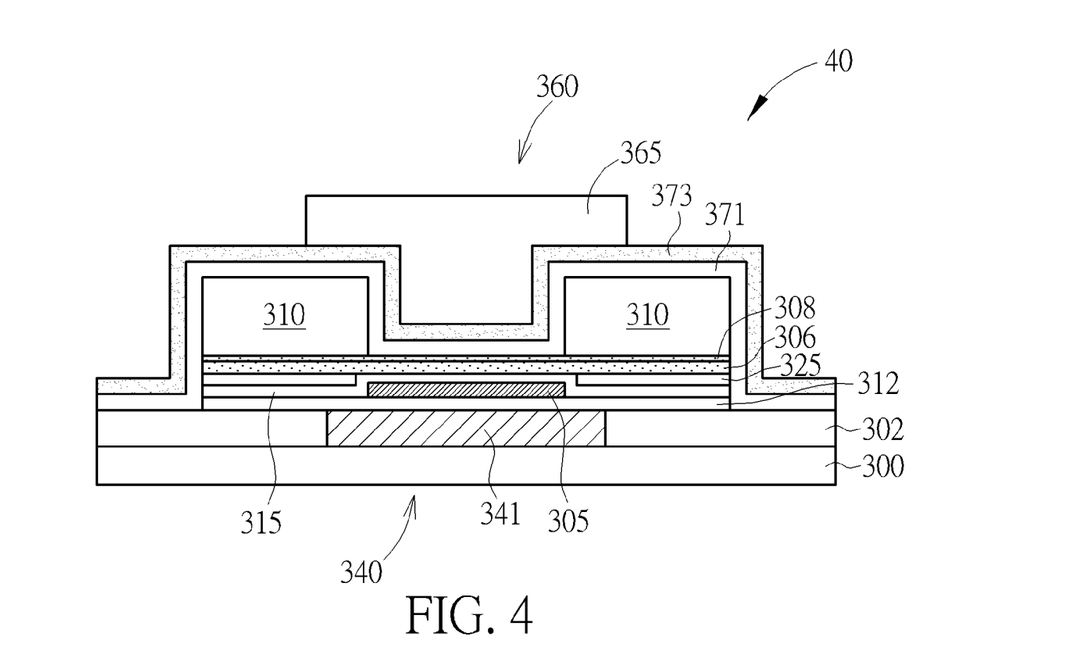
FIGS. 4-5 are schematic cross-sectional views of a semiconductor device in accordance with a second embodiment of the present invention.
Figure 5:
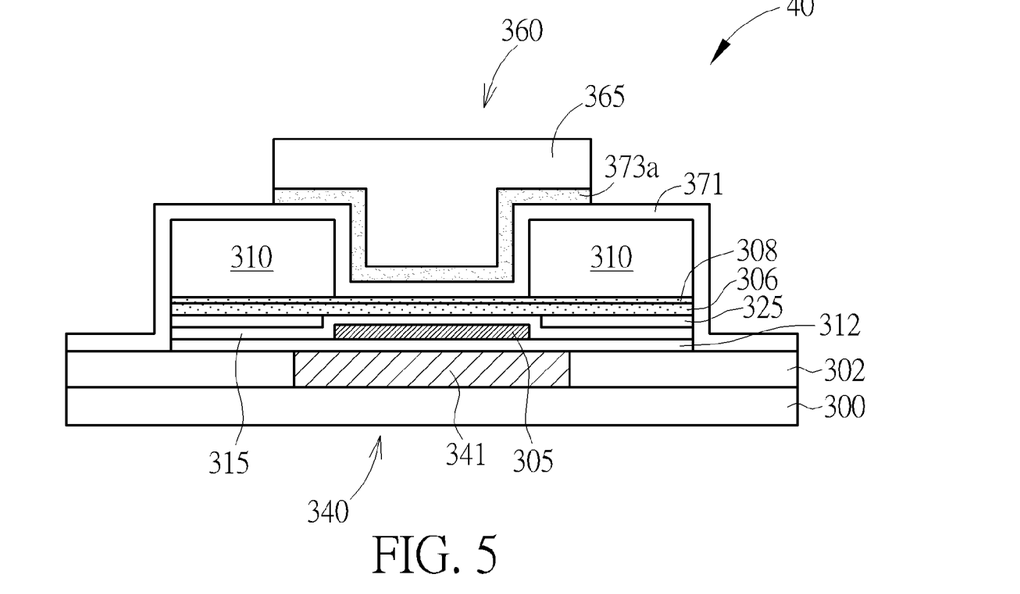

Please refer to FIGS. 4 and 5, which are schematic cross-sectional views of the semiconductor device 40 in accordance with a second embodiment of the present invention. The structure, chosen materials and features of the semiconductor device 40 are substantially the same as the one of semiconductor device 30 shown in FIG. 1. Similar components include the charge trapping structure on the substrate 300, source/drain regions 310, the top gate structure 360 on the charge trapping structure and the back gate structure 340 under the charge trapping structure. The main difference between the semiconductor device 40 and the semiconductor device 30 in the aforesaid embodiment is that the charge trapping structure is a floating gate 305.

In the embodiment, the floating gate 305 is disposed on a dielectric layer 312 on the gate electrode 341. The dielectric layer 312 is, for example, a dielectric layer with oxide-nitride-oxide structure. More specifically, the floating gate 305 is inside an insulating layer 325, and moreover, the floating gate 305 is covered with a protection layer 315 such as a dielectric material like silicon oxide. The forming method of the floating gate 305 may include the following steps of: first, forming a material layer on the gate electrode 341, such as a doped poly-silicon layer. The material layer is then patterned to dispose the floating gate 305 and the gate electrode 341 below in a corresponding arrangement. For example, the floating gate 305 is made to be located in the middle of the gate electrode 341 in the projection direction perpendicular to the substrate 300 and partially covers the gate electrode 341, as shown in FIG. 4. Later, the deposition process and planarization process may be performed to form a protection layer 315 and an insulating layer 325 sequentially on the floating gate 305, wherein the top surface of the insulating layer 325 is flush with the protection layer 315, as shown in FIG. 4. In later process, the protection layer 315, the insulating layer 325 and the material stack of the insulating layer 306, the oxide-semiconductor layer 308 and source/drain regions 310 stacked thereon may be simultaneously patterned in one photo-etching-process, to provide the protection layer 315, the insulating layer 325, the insulating layer 306, the oxide-semiconductor layer 308 and source/drain regions 310 with sidewalls vertically aligning with each other, as shown in FIG. 4.

In addition, it is optional to form the gate dielectric layers 371, 373 between the oxide-semiconductor layer 308 and the gate electrode 365 which directly contact and cover the sidewalls of the source/drain regions 310, the oxide-semiconductor layer 308 and the insulating layer 325, as shown in FIG. 4, to prevent the charge leakage from the lateral surfaces of the floating gate 305. The gate dielectric layer 371 and the gate dielectric layer 373 may optionally include compact dielectric materials such as rare earth oxides of hafnium oxide or aluminum oxide. Alternatively, only the gate dielectric layer 371 in the structure would include compact dielectric materials, and the gate dielectric layer 373 is made to include an oxide-semiconductor material, such as InGaZnO, $InGaO_2$, $InZnO_2$, ZnInO or GaZnO, but not limited thereto. Alternatively, only the gate dielectric layer 371 in the structure is made to cover the sidewall of the insulating layer 325, and the sidewalls of the gate dielectric layer 373a and the gate electrode 365 are vertically aligned through one patterning process, as shown FIG. 5.

The semiconductor device 40 in the embodiment is provided with the floating gate 305 between the back gate structure 340 and the top gate structure 360, so that the back gate structure 340 may be used to control the source/drain regions 310 to store induced charges in the floating gate 305 to change the initial voltage of the back gate structure 340 and achieve the purpose of store 0 or 1 data. In addition, the floating gate 305 has resistivity lower than the dielectric layer 314, 334 of the charge trapping structure 304 to facilitate the storage and uniform distribution of charges, so that the characteristic of data retention of the semiconductor device 40 can be improved. Accordingly, data accessing can be similarly controlled by using the back gate structure 340 to achieve the function of the data storage in semiconductor device 40.

Figure 6:
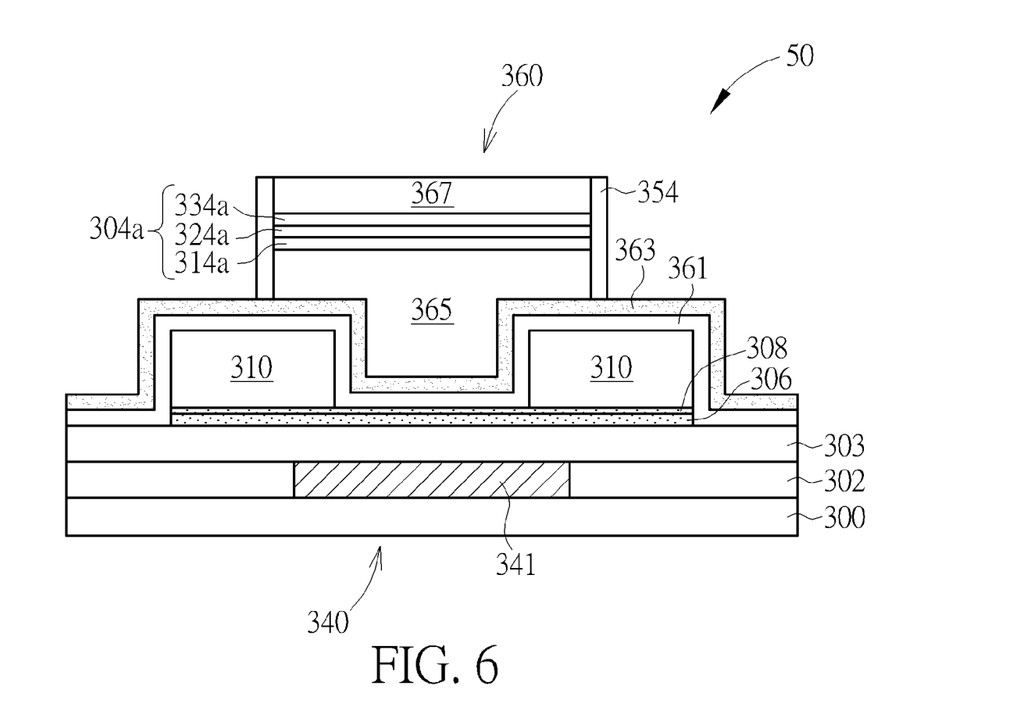
FIGS. 6-7 are schematic cross-sectional views of a semiconductor device in accordance with a third embodiment of the present invention.
Figure 7:
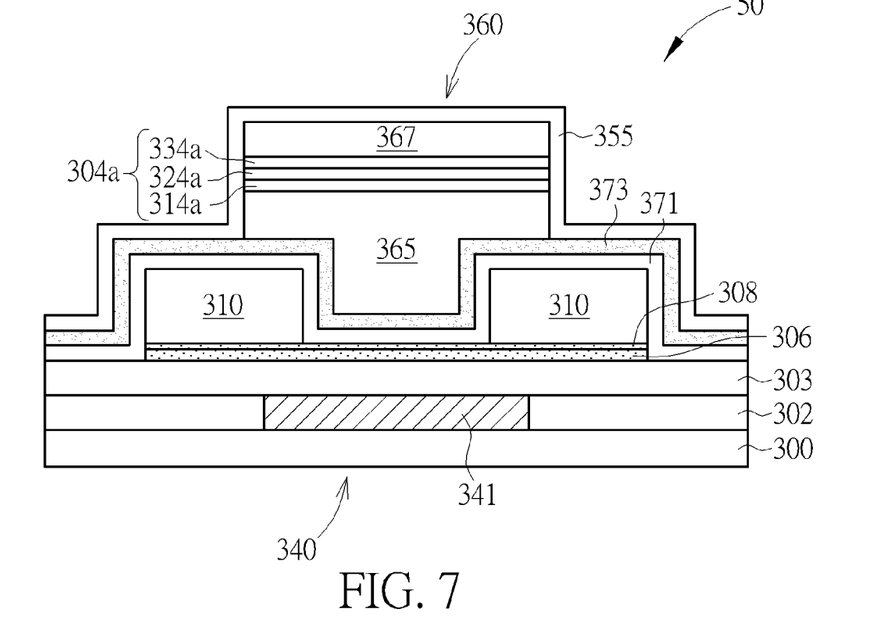

Please refer to FIGS. 6 and 7, which are schematic cross-sectional views of the semiconductor device 50 in accordance with a third embodiment of the present invention. The structure, chosen materials and features of the semiconductor device 50 are substantially the same as the semiconductor device 30 shown in FIG. 1, including the top gate structure 360 and the back gate structure 340. The main difference between the semiconductor device 50 and the semiconductor device 30 in the aforesaid embodiment is that the charge trapping structure 304a is disposed on the top gate structure 360, as shown in FIG. 6, and only one insulating layer 303 is disposed between the back gate structure 340 and the oxide-semiconductor layer 308, such as common low-k dielectrics like silicon oxide, or common high-k dielectrics like hafnium oxide, etc.

Similarly, the charge trapping structure 304a in the embodiment includes a first dielectric layer 314a, a charge trapping layer 324a and a second dielectric layer 334a and is made of the material substantially the same as the charge trapping structure 304 in the aforesaid embodiments. The forming method of the 304a may include the following steps: first forming a material stack on the top gate structure 360. Then, forming a stack layer of the first dielectric layer 314a, the charge trapping layer 324a and the second dielectric layer 334a. The material stack is then patterned simultaneously to make the sidewalls of the charge trapping structure 304a and the gate electrode 365 aligning with each other, and the charge trapping structure 304a may correspond to the gate electrode 365 below, as shown in FIG. 6. However, it should be noted that the charge trapping structure 304a may still correspond to the underlying oxide-semiconductor layer 308 and the gate electrode 341 in the projection direction perpendicular to the substrate 300. For example, the gate electrode 341 is made to locate in the middle of the oxide-semiconductor layer 308 and the charge trapping structure 304a, and is completely covered by the oxide-semiconductor layer 308 and the charge trapping structure 304a, as shown in FIG. 6.

In addition, the charge trapping structure 304a may be provided with a conductive layer 367 thereon, including metals like Cu, Al, Mo, Ti, Ta or the aforesaid metal nitride or metal oxide, etc. The conductive layer 367 is preferably made of the conductive material different from the gate 365, but not limited thereto, and moreover, the conductive layer 367 may be formed along with the charge trapping structure 304 and the gate 365 through one patterning process. Similarly, the sidewall of the conductive layer 367 may be vertically aligned with the sidewalls of the charge trapping structure 304a and the gate electrode 365, as shown in FIG. 6.

On the other hand, semiconductor device 50 may be further provided with a sealing layer 354 that at least covers on the sidewall of the conductive layer 367, the charge trapping structure 304a and the gate electrode 365, as shown in FIG. 6, to prevent charge leakage from the lateral surfaces of the charge trapping structure 304a. The sealing layer 354 may, for example, include compact dielectric materials such as hafnium oxide or aluminum oxide, but not limited thereto. Alternatively, the sealing may completely cover on the top gate structure 360. For example, semiconductor device 50 may be provided with a sealing layer 355 directly contacting and covering the entire top gate structure 360, the charge trapping structure 304a and source/drain regions 310, as shown in FIG. 7.

The semiconductor device 50 is provided with the charge trapping structure 360 on the top gate structure 360, so that the top gate structure 360 may be used to control the source/drain regions 310 to store induced charges in the charge trapping structure 304a and change the initial voltage of the top gate structure 360 to achieve the purpose of store 0 or 1 data. Accordingly, data accessing can be properly controlled by using the top gate structure 360 to achieve the function of the data storage in semiconductor device 50.

Figure 8:
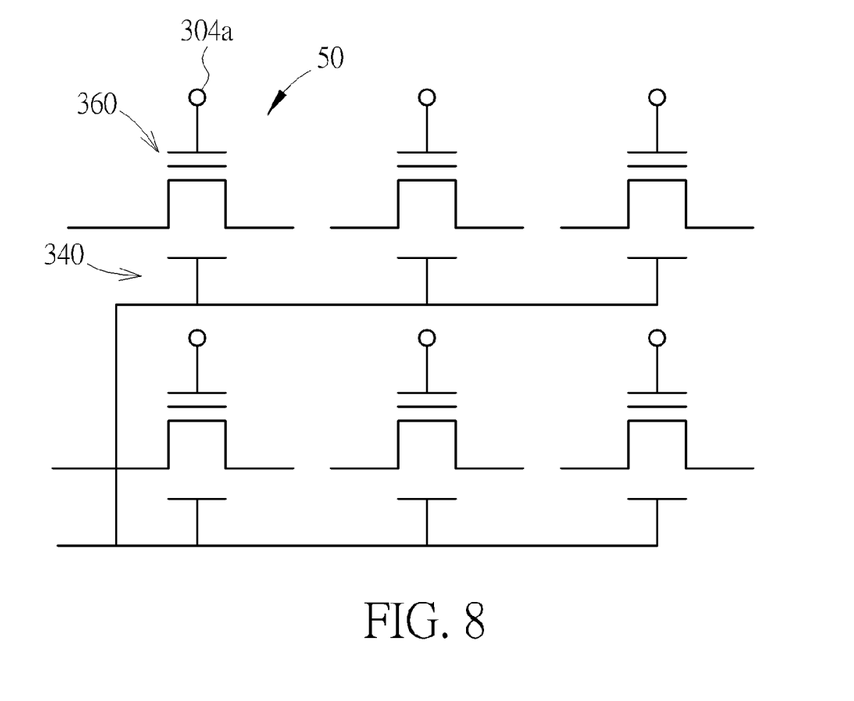
FIG. 8 is an equivalent circuit diagram of the semiconductor device in accordance with the second embodiment of the present invention.

Please refer to FIG. 8, which is an equivalent circuit diagram of the semiconductor device 50. In practical application, the semiconductor device 50 may be used stand-alone, or may be optionally used in serial or parallel connection with multiple semiconductor devices 50, and the back gate structures of semiconductor devices 50 in serial connection and parallel connection may have same initial voltage. Since the charge trapping structure 304a is provided on the top gate structure 360 of the semiconductor devices 50, the 0 or 1 data can be properly stored. Accordingly, the effect of data reading can be achieved through the voltage ($V_{th}$) shift of the back gate structure 340 and the top gate structure 360 when a voltage is supplied to the semiconductor device 50.

Figure 9:
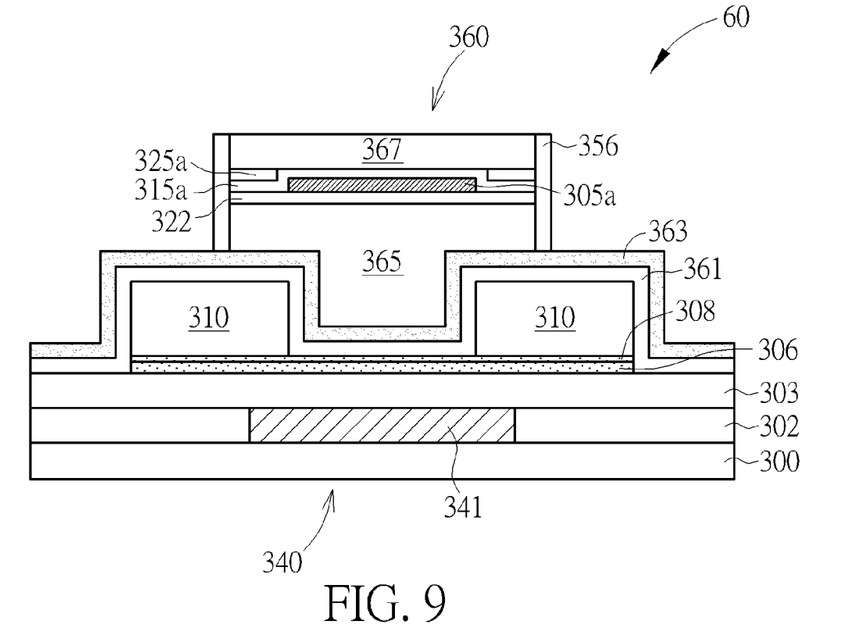
FIGS. 9-10 are schematic cross-sectional views of a semiconductor device in accordance with a fourth embodiment of the present invention.
Figure 10:
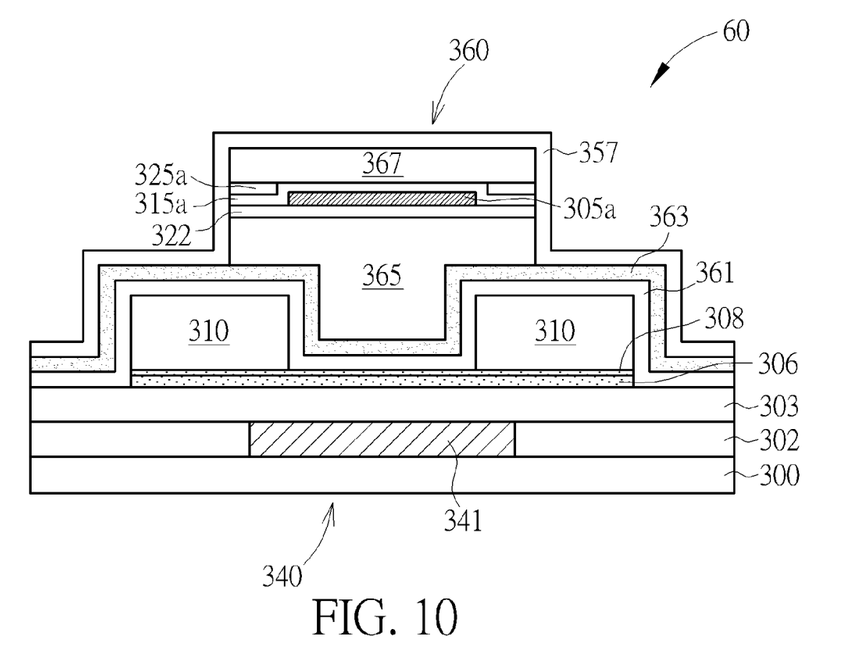

Please refer to FIGS. 9 and 10, which are schematic cross-sectional views of the semiconductor device 60 in accordance with a fourth embodiment of the present invention. The structure, chosen materials and features of the semiconductor device 60 are substantially the same as the semiconductor device 50 shown in FIG. 6, including the charge trapping structure on the top gate structure 360 and the underlying back gate structure 340. The main difference between the semiconductor device 60 and the semiconductor device 50 in the aforesaid embodiment is that the charge trapping structure is a floating gate 305a.

In the embodiment, the floating gate 305a is a dielectric layer disposed on a dielectric layer 322 on the gate electrode 365. The dielectric layer 322 is, for example, a dielectric layer with oxide-nitride-oxide structure. More specifically, the floating gate 305a is inside an insulating layer 325a, and moreover, the floating gate 305a is covered with a protection layer 315a such as a silicon oxide layer. Moreover, the forming method of the floating gate 305a may include the following steps of: first forming a material layer on the gate electrode 365, such as a doped poly-silicon layer. The material layer is then patterned to make the floating gate 305a and the gate electrode 365 below disposing in a corresponding arrangement. Preferably, the floating gate 305a is made to be located in the middle of the gate electrode 365 in the projection direction perpendicular to the substrate 300, as shown in FIG. 9. Later, the deposition process and planarization process may be performed to form a protection layer 315a and insulating layer 325a sequentially on the floating gate 305a, wherein the top surface of the insulating layer 325a is flush with the protection layer 315a, and moreover, it should be noted that the floating gate 305a may still correspond to the underlying gate electrode 341 in the projection direction perpendicular to the substrate 300. For example, the floating gate 305a is made to locate in the middle of the gate electrode 341 and partially covers thereon, as shown in FIG. 9.

Similarly, the semiconductor device 60 may be provided with a sealing layer 356 such as compact dielectric materials like hafnium oxide or aluminum oxide. The sealing layer 356 may at least cover on the sidewalls of the conductive layer 367, the floating gate 305a and the gate electrode 365, as shown in FIG. 9, to prevent charge leakage from the lateral surfaces of the floating gate 305a. Alternatively, the sealing layer 356 may completely cover the top gate structure 360. For example, semiconductor device 60 may be provided with a sealing layer 357 that directly contacts and covers the entire top gate structure 360, the floating gate 305a and the source/drain regions 310, as shown in FIG. 10.

The semiconductor device 60 in the embodiment is provided with the floating gate 305a on the top gate structure 360, so that the top gate structure 360 may be used to control the source/drain regions 310 to store induced charges in the floating gate 305a to change the initial voltage of the top gate structure 360 and achieve the purpose of store 0 or 1 data. Accordingly, data accessing can be properly controlled by using the top gate structure 360 to achieve the function of the data storage in semiconductor device 60.

The semiconductor device of the present invention is provided with oxide-semiconductor structures for data storage. The primary approach is to dispose a charge storage structure between the gate electrode as a back gate structure and an oxide-semiconductor layer served as a channel layer, or to dispose the charge storage structure on the gate electrode of a top gate structure. The charge storage structure may be a charge trapping structure or a floating gate. In other words, the gate electrode of the back gate structure or the top gate structure is used as a control gate to store induced charge in the charge storage structure. In this way, the function of signal reading may be achieved by voltage changes in the semiconductor device of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   an oxide-semiconductor layer on a first gate electrode on said substrate;
   two source/drain regions on said oxide-semiconductor layer;
   a first dielectric layer covering on said oxide-semiconductor layer and said two source/drain regions;
   a second gate electrode between said two source/drain regions and partially covering said oxide-semiconductor layer; and
   a charge storage structure on said second gate electrode.

2. The semiconductor device of claim 1, further comprising:
   a sealing layer on said substrate and covering the sidewall of said charge storage structure.

3. The semiconductor device of claim 2, wherein said sealing layer covers said oxide-semiconductor layer, said two source/drain regions, said charge storage structure and said second gate electrode.

4. The semiconductor device of claim 2, wherein said sealing layer comprises a dielectric material.

5. The semiconductor device of claim 1, wherein said charge storage structure comprises an oxide-nitride-oxide structure.

6. The semiconductor device of claim 1, wherein said charge storage structure comprises a floating gate.

7. The semiconductor device of claim 6, further comprising:
   a second dielectric layer between said second gate electrode and said floating gate.

8. The semiconductor device of claim 6, wherein said floating gate covers said first gate electrode in a projection direction.

9. The semiconductor device of claim 6, further comprising:
   a conductive layer on said floating gate.

10. The semiconductor device of claim 9, wherein said conductive layer is provided with a conductive material different from the material of said second gate electrode.

* * * * *